United States Patent
Lu et al.

(10) Patent No.: US 10,254,876 B2
(45) Date of Patent: Apr. 9, 2019

(54) ARRAY SUBSTRATE, FABRICATING METHOD THEREOF AND DISPLAY DEVICE

(71) Applicants: BOE TECHNOLOGY GROUP CO., LTD., Beijing (CN); CHENGDU BOE OPTOELECTRONICS TECHNOLOGY CO., LTD., Chengdu, Sichuan (CN)

(72) Inventors: Youqiang Lu, Beijing (CN); Xiaojing Qi, Beijing (CN); Zhidong Wang, Beijing (CN); Jing Wang, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan (CN)

( * ) Notice: Subject to any disclaimer, the term of this patent is extended or adjusted under 35 U.S.C. 154(b) by 0 days.

(21) Appl. No.: 14/914,399

(22) PCT Filed: Sep. 25, 2015

(86) PCT No.: PCT/CN2015/090713
§ 371 (c)(1),
(2) Date: Feb. 25, 2016

(87) PCT Pub. No.: WO2016/141709
PCT Pub. Date: Sep. 15, 2016

(65) Prior Publication Data
US 2017/0045984 A1    Feb. 16, 2017

(30) Foreign Application Priority Data

Mar. 6, 2015 (CN) .......................... 2015 1 0101319

(51) Int. Cl.
*G06F 3/041* (2006.01)
*G06F 3/044* (2006.01)
(Continued)

(52) U.S. Cl.
CPC ............ *G06F 3/0416* (2013.01); *G06F 3/044* (2013.01); *G06F 3/0412* (2013.01);
(Continued)

(58) Field of Classification Search
None
See application file for complete search history.

(56) References Cited

U.S. PATENT DOCUMENTS 9,057,906 B2    6/2015    Yang et al.
9,519,374 B2    12/2016   Liu et al.
(Continued)

FOREIGN PATENT DOCUMENTS

CN    202159326 U    3/2012
CN    102937853 A    2/2013
(Continued)

OTHER PUBLICATIONS

First Chinese Office Action dated Mar. 13, 2017; Appln. No. 201510101319.8.
(Continued)

*Primary Examiner* — Matthew Yeung
(74) *Attorney, Agent, or Firm* — Ladas & Parry LLP

(57) ABSTRACT

An array substrate, a fabricating method thereof and a display device, the fabricating method comprises forming a plurality of touch electrodes on a base substrate, a plurality of touch electrode leads for leading out signals of the touch electrodes and an array structure comprising a plurality of conducting structures. At least part of touch electrode leads and at least one of the conducting structures are disposed in a same layer and made from a same material. The fabricating method can reduce the amount of masks used in the fabricating process of the array substrate.

16 Claims, 3 Drawing Sheets

(51) Int. Cl.
*H01L 27/12* (2006.01)
*H01L 29/786* (2006.01)

(52) U.S. Cl.
CPC ...... *H01L 27/1222* (2013.01); *H01L 27/1288* (2013.01); *H01L 29/78675* (2013.01); *G06F 2203/04103* (2013.01); *G06F 2203/04111* (2013.01); *H01L 27/124* (2013.01); *H01L 29/78633* (2013.01); *H01L 29/78645* (2013.01)

(56) References Cited

U.S. PATENT DOCUMENTS

| | | | |
|---|---|---|---|
| 2014/0232955 A1 | 8/2014 | Roudbari et al. | |
| 2014/0253473 A1* | 9/2014 | Kim | G06F 3/044 345/173 |
| 2015/0084912 A1* | 3/2015 | Seo | G06F 3/0412 345/174 |
| 2016/0004346 A1 | 1/2016 | Zhao | |
| 2016/0041666 A1* | 2/2016 | Lee | G02F 1/13338 345/174 |
| 2016/0139706 A1* | 5/2016 | Lee | G06F 3/044 345/174 |
| 2016/0187693 A1* | 6/2016 | Woo | G02F 1/13338 257/72 |
| 2016/0259460 A1 | 9/2016 | Yang et al. | |
| 2016/0274716 A1 | 9/2016 | Liu et al. | |

FOREIGN PATENT DOCUMENTS

| | | |
|---|---|---|
| CN | 103699284 A | 4/2014 |
| CN | 104020893 A | 9/2014 |
| CN | 102541383 B | 11/2014 |
| CN | 104716144 A | 6/2015 |
| KR | 20130067869 A | 6/2013 |
| WO | 2015/010421 A1 | 1/2015 |

OTHER PUBLICATIONS

International Search Report and English Translation of the Written Opinion dated Dec. 30, 2015; PCT/CN2015/090713.

The Second Chinese Office Action dated Sep. 4, 2017; Appln. 201510101319.8.

The Extended European Search Report dated Nov. 7, 2018; Appln. No. 15832870.8.

\* cited by examiner

ARRAY SUBSTRATE, FABRICATING METHOD THEREOF AND DISPLAY DEVICE

TECHNICAL FIELD

At least one embodiment of the present disclosure relates to an array substrate, a fabricating method thereof and a display device.

BACKGROUND

Touch panels have gradually been spread throughout the life of people. Especially, ADS (Advanced-super Dimension Switch) mode touch panels with a wide-viewing angle have huge market potential.

So far, the ADS technology is one of mainstream wide-viewing angle technologies of TFT-LCD (Thin Film Transistor-Liquid Crystal Display). ADS mode TFT-LCDs have advantages such as simple fabricating process, wide-viewing angle, high aperture ratio, low response time and so on. Capacitive touch panels are widely used in smart portable terminals such as mobile phone, tablet computer etc. because they provide good user experience.

SUMMARY

An array substrate, a fabricating method thereof and a display device according to at least one embodiment of the present disclosure can reduce the amount of masks used in the process of fabricating the array substrate.

An array substrate according to at least one embodiment of the present disclosure comprises a base substrate, a plurality of touch electrodes disposed on the base substrate, a plurality of touch electrode leads disposed on the base substrate for leading out signals of the touch electrodes respectively, and an array structure disposed on the base substrate comprising a plurality of conducting structures; at least part of each touch electrode lead and at least one of the conducting structures are disposed in a same layer and are made from a same material.

A display device according to at least one embodiment of the present disclosure comprises the array substrate mentioned above.

A fabricating method of an array substrate according to at least one embodiment of the present disclosure comprises: forming a plurality of touch electrodes on a base substrate; forming a plurality of touch electrode leads on the base substrate for leading out signals of the touch electrodes; and forming an array structure comprising a plurality of conducting structures on the base substrate, for making at least part of each touch electrode lead and at least one of the conducting structures be formed in a same mask process.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used in the present disclosure have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1:
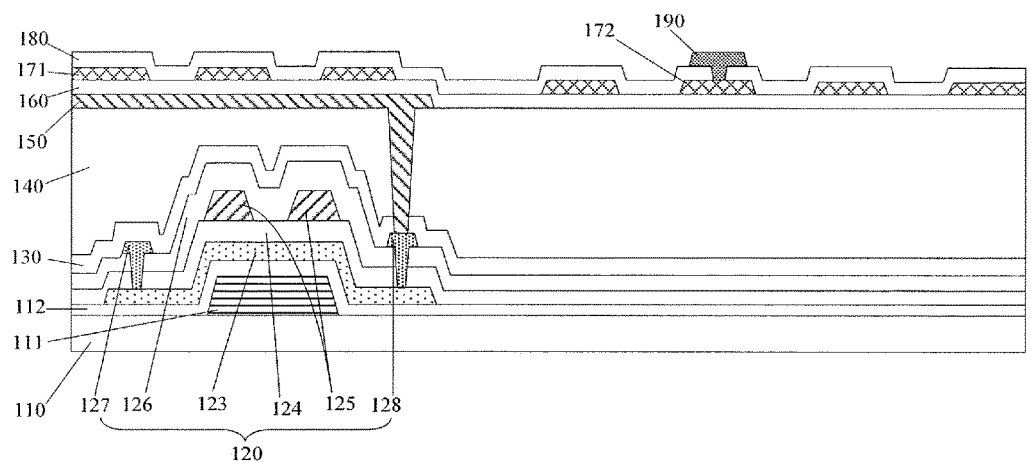
FIG. 1 is a cross-section schematic view of an ADS mode array substrate.

FIG. 1 is a cross-section schematic view of an ADS mode array substrate. As shown in FIG. 1, the ADS mode array substrate uses low temperature poly-silicon thin film transistors, and a fabricating method thereof usually comprises the following steps S01 to S14 which are described one by one as follows.

Step S01: forming a shielding layer 111 on a base substrate 110 through a first mask process.

Step S02: forming a buffer layer 112 covering the shielding layer 111.

Step S03: forming an active layer 123 on the buffer layer 112 through a second mask process.

Step S04: forming a gate insulating layer 124 covering the active layer 123; forming a photoresist pattern on the gate insulating layer 124 through a third mask process; then doping the active layer 123 with the photoresist pattern as a mask to form an active region, a source doped region and a drain doped region in the active layer 123, and the active region corresponding to the shielding layer 111, the source doped region and the drain doped region being located at two sides of the active region respectively; and removing the photoresist after doping.

Step S05: forming a gate electrode 125 and a gate line on the gate insulating layer 124 through a fourth mask process. The gate electrode 125 corresponds to the active region. For example, a common electrode line also can be formed in the present mask process.

Step S06: forming an intermediate dielectric layer 126 covering the gate electrode 125, and forming via holes at locations corresponding to the source doped region and the drain doped region respectively through a fifth mask process to expose the source doped region and the drain doped region.

Step S07: forming a source electrode 127, a drain electrode 128 and a data line on the intermediate dielectric layer 126 through a sixth mask process. The source electrode 127 contacts the source doped region through the via hole formed in the step S06, and the drain electrode 128 contacts the drain doped region through the via hole formed in the step S06.

Step S08: forming a first passivation layer 130 covering a thin film transistor 120.

Step S09: forming a planarizing layer 140 on the first passivation layer 130, and forming a via hole at the location corresponding to the drain electrode 128 through a seventh mask process to expose the drain electrode 128.

Step S10: forming a pixel electrode 150 on the planarizing layer 140 through a eighth mask process, and the pixel electrode 150 contacts the drain electrode 128 through the via hole formed in the step S09.

Step S11: forming a second passivation layer 160 covering the pixel electrode 150, and forming a via hole at location corresponding to a common electrode line (not shown in FIG. 1) to expose the common electrode line.

Step S12: forming a common electrode layer on the second passivation layer 160 through a tenth mask process. For example, a common electrode 171 and a touch electrode 172 are formed in the common electrode layer, and the common electrode 171 is connected with the corresponding common electrode line through the via hole formed in the step S11.

Step S13: forming a third passivation layer 180 covering the common electrode layer 171 and the touch electrode 172, and forming a via hole at a location corresponding to the touch electrode 172 through a eleventh mask process to expose the touch electrode 172.

Step S14: forming a touch electrode lead 190 on the third passivation layer 180 through a twelfth mask process to make each touch electrode connect with one touch electrode lead 190 through the via hole formed in the step S13.

In research, the inventors of the present application notice that a large number of masks are used in the fabricating process of a touch panel using the array substrate shown in FIG. 1, and the fabricating cost is high; even if the touch electrodes are fabricated using the common electrode layer, the step S13 in which the via holes are formed in the third passivation layer 180 and the step S14 in which the touch electrodes leads 190 of the touch electrodes are fabricated still need to be added. In this case, 14 steps and 12 masks are required just for fabricating the array substrate.

An array substrate, a fabricating method thereof and a display device according to at least one embodiment of the present disclosure, by allowing at least part of the touch electrode lead and the original conducting structures (such as gate electrodes and source/drain electrodes of thin film transistors or the shielding layer) on the array substrate to be disposed in a same layer and made from a same material, can simplify the structure of the array substrate, can reduce the amount of masks used in the fabricating process and can reduce the cost.

Figure 2A:
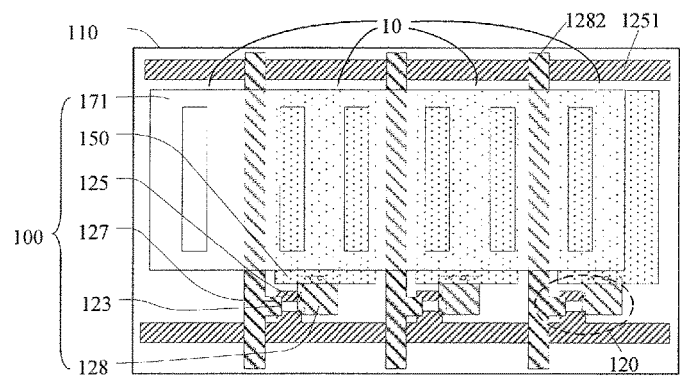
FIG. 2a is a top schematic view of an array substrate according to an embodiment of the present disclosure.

An array substrate according to at least one embodiment of the present disclosure is shown in FIG. 2a. The array substrate comprises a base substrate 110, a plurality of touch electrodes (not shown in FIG. 2a) disposed on the base substrate 110, a plurality of touch electrode leads (not shown in FIG. 2a) disposed on the base substrate for leading out signals of the touch electrodes respectively, and an array structure 10 disposed on the base substrate comprising a plurality of conducting structures 100; at least part of each touch electrode lead and at least one of the conducting structures 100 are disposed in a same layer, i.e., formed in a same mask process.

In embodiments of the present disclosure, one mask process means a patterning process of a thin film layer through exposing a photoresist using one mask. For example, it can comprise steps such as exposing, developing, etching and so on.

In the array substrate, the array structure 10 can comprise a plurality of thin film transistors 120. For example, each thin film transistor 120 can comprise a gate electrode 125, a source electrode 127 and a drain electrode 128, and the gate electrode 125, the source electrode 127 and the drain electrode 128 belong to the conducting structures 100 mentioned above.

Or, for example, the array substrate 10 can further comprise a plurality of shielding layers (not shown in FIG. 2a) on the basis of the plurality of thin film transistors 120 which it comprises. Each shielding layer is disposed between an active layer 123 of each thin film transistor 120 and the base substrate 110, and the shielding layers also can belong to the conducting structures 100. In embodiments of the present disclosure, a shielding layer being disposed between the base substrate and the active layer of thin film transistor can prevent the light emitted from a backlight from illuminating the active layer of the thin film transistor, and thus can reduce the leakage current of the thin film transistor.

In the case shown in FIG. 2a, the array substrate comprises a plurality of gate lines 1251 and a plurality of data lines 1282, and gate lines 1251 and data lines 1282 are intersected with each other to define a plurality of sub-pixel units. In this case, for example, the array structure 10 is an array of sub-pixel units. Of course, embodiments of the present disclosure comprise but are not limited to this configuration. Any structure comprising a plurality of conducting structures arrayed on the array substrate can serve as the array substrate. For example, the array substrate 10 also can be an array of thin film transistors 120.

For example, in at least one of the embodiments, the touch electrode leads and the touch electrodes are disposed in different layers, that is, the touch electrode leads and the touch electrodes are formed from different films.

In the embodiments of the present disclosure, the touch electrode lead can be a one-piece structure (i.e., an integrated continuous structure), or it also can comprise a plurality of components.

For example, each touch electrode lead and any one of the conducting structures can be disposed in a same layer and be made from a same material. In this case, each touch electrode lead is a one-piece structure such as a linear structure, and thus each touch electrode lead can be formed in one mask process. For example, each touch electrode lead and any one of a gate electrode, a source electrode, a drain electrode or a shielding layer are disposed in a same layer and are made from a same material.

As shown in FIG. 2a, a plurality of gate lines 1251 and a plurality of data lines 1282 intersect with each other are disposed on the base substrate 110 of the array substrate. For example, a gate line 1251 and a gate electrode 125 of a thin film transistor 120 are connected and are formed in a same mask process; for example, a data line 1282 and the source electrode 127 of the thin film transistor 120 are connected and are formed in a same mask process. Therefore, if the touch electrode leads and the gate lines of the thin film transistors are disposed in a same layer and are made of a same material, in order to make the touch electrode leads be insulated from the gate lines, the touch electrode leads can be disposed in the spaces between the gate lines, and for example, the touch electrode leads and the gate lines extend in a same direction; similarly, if the touch electrode leads and the source electrodes and drain electrodes of the thin film transistors are disposed in a same layer and are made from a same material, the touch electrode leads can be disposed in the spaces between the data lines, and for example, the touch electrode leads and the data lines extend in a same direction. But, if the amount of the touch electrode leads and gate lines or data lines is large, this configuration leads to a complex arrangement of lines in the layer where the gate lines are disposed or the data lines are disposed.

In order to arrange the lines more flexible in the layer where the gate lines are disposed or the data lines are disposed, each touch electrode lead is configured for comprising a plurality of components (portions). At least one embodiment of the present disclosure provides a way that not only can insure that the touch electrode leads are insulated from the gate lines and the data lines, but also facilitate the flexible arrangement of lines.

For example, each touch electrode lead can comprise at least two first linear portions and at least one first bridging portion; and the at least two first linear portions and the gate lines are disposed in a same layer; the touch electrode lead intersects with at least one of the gate lines, and two adjacent first linear portions are connected through a first bridging portion at an intersection of the touch electrode lead with the gate line.

Or, for example, each touch electrode lead can comprise at least two first linear portions and at least one first bridging portion; and the at least two first linear portions and the data lines are disposed in a same layer; the touch electrode lead intersects with at least one of the data lines, and two adjacent first linear portions are connected through a first bridging portion at an intersection of the touch electrode lead with the data line.

In the embodiments of the present disclosure, if the touch electrode lead comprises a plurality of components, part or all of the components can be formed in the original mask process of the array substrate. Therefore, at least one structure of the first linear portions of the touch electrode lead and the first bridging portion is formed in a same mask process as the original conducting structures on the array substrate, i.e., disposed in a same layer and made from a same material.

For example, if the at least two first linear portions and the gate lines are disposed in a same layer, the first linear portions, the gate lines and the gate electrodes are disposed in a same layer and are made from a same material; if the at least two first linear portions and the data lines are disposed in a same layer, the first linear portions, the data lines, the source electrodes and the drain electrodes are disposed in a same layer and are made from a same material.

For example, if the at least two first linear portions and the gate lines are disposed in a same layer, the first bridging portion, the source electrodes and the drain electrodes are disposed in a same layer and are made from a same material; if the at least two first linear portions and the data lines are disposed in a same layer, the first bridging portion and the gate electrodes are disposed in a same layer and are made from a same material.

For example, the first linear portions of touch electrode leads and the gate electrodes are disposed in a same layer and are made from a same material, and the first bridging portions, the source electrodes and the drain electrodes are disposed in a same layer and are made from a same material; or, the first linear portions of touch electrode leads, the source electrodes and the drain electrodes are disposed in a same layer and are made from a same material, and the first bridging portions and the gate electrodes are disposed in a same layer and are made from a same material.

For example, if the array structure mentioned above comprises a plurality of thin film transistors and a plurality of shielding layers, and each shielding layer is disposed between an active layer of each thin film transistor and the base substrate, the first bridging portions and the shielding layers are disposed in a same layer and are made from a same material, and the first linear portions and other conducting structures can be disposed in a same layer.

In at least one embodiment, an active layer of each thin film transistor comprises an active region, a source doped region and a drain doped region, and the source electrode and the drain electrode contact with the source doped region and the drain doped region through first via holes respectively; the first bridging portions are connected to first linear portions through second via holes, and the layer in which at least part of the second via holes is formed is the same as the layer in which at least part of the first via holes is formed. If the layers where the first via holes pass and the layers where the second via holes pass are not completely the same, the etching degrees are different in etching process. By making at least part of the layers where the first via holes pass and the layers where the second via holes pass be the same, embodiments of the present disclosure can realize forming the via holes connecting the first bridging portions and the first linear portions in the mask process which is originally used for fabricating the via holes, and thus further reduce the process and the amount of masks.

For example, a first insulating layer is disposed on the active layer of the thin film transistor; gate electrodes and first linear portions are disposed on the first insulating layer; a second insulating layer covers the gate electrodes and the first linear portions; and source electrodes, drain electrodes and first bridging portions are disposed on the second insulating layer. In this case, the first via holes pass through the first insulating layer and the second insulating layer (i.e., comprise a part in the first insulating layer and a part in the second insulating layer); and the second via holes pass through the second insulating layer. Thus, the first via holes and the second via holes are formed through one mask process before the source electrodes, the drain electrodes and the first bridging portions are formed.

If the array substrate is an ADS mode array substrate, a common electrode layer (for example, as shown in FIG. 2a, the layer where the common electrode 171 is disposed) is disposed in the ADS mode array substrate. In order to further reduce the process and the amount of masks, the plurality of touch electrodes can be disposed in the common electrode layer, thus the touch electrodes can be fabricated using the common electrode layer. For example, common electrodes and touch electrodes can be disposed in the common electrode layer respectively, and a display function and a touch function can be realized through time-sharing driving; only touch electrodes may be disposed in the common electrode layer without disposing common electrodes, and the electrodes in the common electrode layer serve as common electrodes during a display period and serve as touch electrodes during a touch period through a reused way.

In the array substrate, common electrode lines are usually disposed under the common electrode layer (i.e., between the common electrode layer and the base substrate), and the common electrodes are connected with the corresponding common electrode lines through via holes. Therefore, in at least one embodiment, the touch electrode leads can be disposed between the common electrode layer and the base substrate. Thus, if the plurality of touch electrodes are disposed in the common electrode layer, the via holes corresponding to the common electrode lines and the via holes for connecting the touch electrodes and the corresponding touch electrode leads can be formed in a same mask process, and thus the processes can be simplified and the amount of masks are reduced.

In the embodiments of the present disclosure, the touch electrodes and the linear portions of the touch electrodes can be directly connected through the via holes, or they can be connected through other connecting structures to improve the flexibility of arrangement of touch electrode leads. For example, each touch electrode lead comprises a second linear portion and a second bridging portion, and the second bridging portion connects a touch electrode corresponding to the touch electrode lead to the second linear portion.

In the embodiments of the present disclosure, the components of the touch electrode leads can be formed in the mask process which is used for fabricating original conducting structure on the array substrate, without new mask process being added; or part of the components can be formed in the mask process which is used for fabricating original conducting structure on the array substrate.

For example, the array substrate 10 mentioned above can further comprise a plurality of first electrodes (for example, the pixel electrodes 150 shown in FIG. 2a) connected with the thin film transistors respectively on the basis of the plurality of thin film transistors 120, and the first electrodes belong to the conducting structures 100 mentioned above. In this case, the second bridging portion of the touch electrode leads and the first electrodes comprised in the array substrate can be disposed in a same layer and be made from a same material.

For example, the second linear portion of the touch electrode leads can be formed in an added mask process on the basis of the pre-existing mask process of the array substrate.

It should be noted that the array substrate according to embodiments of the present disclosure can be an array substrate used for a liquid crystal display, an array substrate used for an organic light emitting diode (OLED) and so on. Correspondingly, if the array substrate is an array substrate used for a liquid crystal display, as shown in FIG. 2, the first electrodes are pixel electrodes 150, and for example, they are connected with the drain electrodes 128 of the thin film transistors 120; if the array substrate is an OLED array substrate, for example, the first electrodes are anodes, and they are connected with the drain electrodes of the thin film transistors. Embodiments of the present disclosure are not limited to the above cases.

In the array substrate, for example, the first electrodes are connected with the thin film transistors through via holes. Therefore, in at least one embodiment, the second linear portions of the touch electrode leads can be disposed between the layer where the first electrodes are disposed and the base substrate. Thus, because the second bridging portions of the touch electrode leads and the first electrode layer are disposed in a same layer, the via holes for connecting the first electrodes and, for instance, the drain electrodes of the thin film transistors, the via holes for connecting the second bridging portions and the corresponding touch electrodes, and the via holes for connecting the second bridging portions and the corresponding second linear portions can be formed in a same mask process, and thus simplify the process and reduce the amount of masks.

If the array substrate is an array substrate used for a liquid crystal display, the array substrate further comprises a common electrode layer (for example, as shown in FIG. 2a, the layer as the common electrodes 171 are disposed) disposed on the base substrate. In at least one embodiment, if the touch electrode leads comprise the second linear portions and the second bridging portions, the touch electrodes mentioned above can be disposed in the common electrode layer. As for the arrangement of the common electrode layer, the related descriptions mentioned in above embodiments can be referred to, and redundant description will not be repeated here.

In the embodiments of the present disclosure, if the touch electrodes are disposed in the common electrode layer, the first electrodes mentioned above are pixel electrodes. The pixel electrodes can be disposed in the upper layer and the common electrodes are disposed in the lower layer; or, the pixel electrodes are disposed in the lower layer and the common electrodes are disposed in the upper layer.

In at least one embodiment, the second linear portions of the touch electrode leads can be disposed between the layer where the pixel electrode are disposed and the common electrode layer, and thus the via holes for connecting the second bridging portions and the corresponding touch electrodes and the via holes for connecting the second bridging portions and the corresponding second linear portions can be formed in the original via hole process of the array substrate to simplify the process. For example, according to the actual situation, the via holes for connecting the second bridging portions and the corresponding touch electrodes and the via holes for connecting the second bridging portions and the corresponding second linear portions can be formed in one mask process while forming the via holes for connecting the common electrodes and the common electrode lines or the via holes for connecting pixel electrodes and the drain electrodes.

In the embodiments of the present disclosure, the gate electrodes, the source electrodes, the drain electrodes of the thin film transistors and the shielding layer can be formed of a metal material such as aluminum, copper or any alloy thereof, and can have a single-layer structure or a multi-layer structure. The pixel electrodes and the common electrodes can be formed of a transparent conducting material such as indium tin oxide or indium zinc oxide. The buffer layer, the gate insulating layer and the intermediate dielectric layer can be formed of a material such as $SiN_x$, $Si_xNi_yO$ and $SiO_2$ of single-layer or multi-layer. The planarizing layer can be formed of an organic insulating material such as resin. And no limitation is placed thereto herein.

In order to reduce the resistance of the touch electrode leads as much as possible, in embodiments of the present disclosure mentioned above, the touch electrode leads are formed of a metal material; or, if the touch electrode leads comprises linear portions and bridging portions, at least the linear portions of the touch electrode leads are formed of a metal material, and the bridging portions can be formed of a metal material or also can be formed of a transparent conducting material.

A display device is provided by at least one embodiment of the present disclosure. The display device comprises an array substrate according to any one of the embodiments mentioned above. For example, the display device can further comprise an opposite substrate (for example, a color film substrate) disposed opposite to the array substrate, the opposite substrate and the array substrate are sealed together by a sealant. For example, the display device can be any product or component having a display function such as display panel, electronic paper, OLED panel, mobile phone, tablet computer, television, display screen, laptop computer, digital photo frame, navigator, watch or the like.

A fabricating method of an array substrate is provided by at least one embodiment of the present disclosure. The fabricating method comprises: forming a plurality of touch electrodes on a base substrate, forming a plurality of touch electrode leads on the base substrate for leading out signals of the touch electrodes; and forming an array structure comprising a plurality of conducting structures on the base substrate to make at least part of each touch electrode lead and at least one of the conducting structures be formed in a same mask process.

In the array substrate, the array substrate can comprise a plurality of thin film transistors. For example, each thin film transistor can comprise a gate electrode, a source electrode and a drain electrode, and the gate electrode, the source electrode and the drain electrode belong to the conducting structures mentioned above.

Or, for example, the array substrate can further comprise a plurality of shielding layers on the basis of the plurality of thin film transistors. Each shielding layer is disposed between an active layer of each thin film transistor and the base substrate, and the shielding layers also can belong to the conducting structures. In embodiments of the present disclosure, the shielding layer being disposed between the base substrate and the active layer of thin film transistor can prevent the light emitted from a backlight from illuminating the active layer of the thin film transistor, and thus can reduce the leakage current of the thin film transistor.

Therefore, in at least one embodiment of the present disclosure, touch electrode leads and any one of the conducting structures can be formed in a same mask process. For example, the touch electrode leads and the gate electrodes of the thin film transistors are formed in a mask process; or the touch electrode leads, the source electrodes of the thin film transistors and the drain electrodes of the thin film transistors are formed in a mask process; or the touch electrode leads and the shielding layer comprised in the array substrate are formed in a mask process, and the shielding layer is disposed between the base substrate and the active layer of the thin film transistor.

In embodiments of the present disclosure, each touch electrode lead and gate lines can be disposed in a same layer and intersected with each other. For example, each touch electrode lead is insulated from gate lines and data lines and intersects with at least one of the gate lines or data lines; each touch electrode lead comprises at least two first linear portions and at least one first bridging portion; and the at least two first linear portions and the gate lines are disposed in a same layer; the touch electrode lead intersects with at least one of the gate lines, and two adjacent first linear portions are connected through a first bridging portion at an intersection of the touch electrode lead with the gate line; or, the at least two first linear portions and the data lines are disposed in a same layer; the touch electrode lead intersects with at least one of the data lines, and two adjacent first linear portions are connected through a first bridging portion at an intersection of the touch electrode lead with the data line.

For example, if the at least two first linear portions and the gate lines are disposed in a same layer, the at least two first linear portions, the gate lines and the gate electrodes of thin film transistors can be formed in a same mask process; or, if the at least two first linear portions and the data lines are disposed in a same layer, the at least two first linear portions, the data lines, the source electrodes of thin film transistors and the drain electrodes of thin film transistors can be formed in a same mask process.

For example, if the at least two first linear portions and the gate lines are disposed in a same layer, the first bridging portions, the source electrodes of the thin film transistors and the drain electrodes of the thin film transistors can be formed in one mask process; or, if the at least two first linear portions and the data lines are disposed in a same layer, the first bridging portions, the gate electrodes of the thin film transistors can be formed in one mask process.

For example, if the array structure mentioned above further comprises a plurality of shielding layers on the basis of the plurality of thin film transistors and each shielding layer is disposed between the active layer of each thin film transistor and the base substrate, the first bridging portions and the shielding layer can be formed in one mask process.

It should be noted that the processes for fabricating the first linear portions and the first bridging portions can be optionally used in combination according to actual requirement, which will not be repeated here.

In the embodiments of the present disclosure, the touch electrodes and the linear portions of the touch electrodes can be directly connected through via holes, or they also can be connected through other connecting structures to improve the flexibility of arrangement of touch electrode leads. For example, each touch electrode lead comprises a second linear portion and a second bridging portion, and the second bridging portion connects a touch electrode corresponding to the touch electrode lead to the second linear portion.

For example, the first electrodes disposed on the base substrate and connected with the thin film transistors and the second bridging portions can be formed in one mask process. As for the arrangement of the first electrodes, the related descriptions mentioned in above embodiments can be referred to, and redundant description will not be repeated here.

The array substrate and fabricating method thereof according to embodiments of the present disclosure will be described in detail in combination with the specific embodiments.

First Embodiment

Figure 2B:
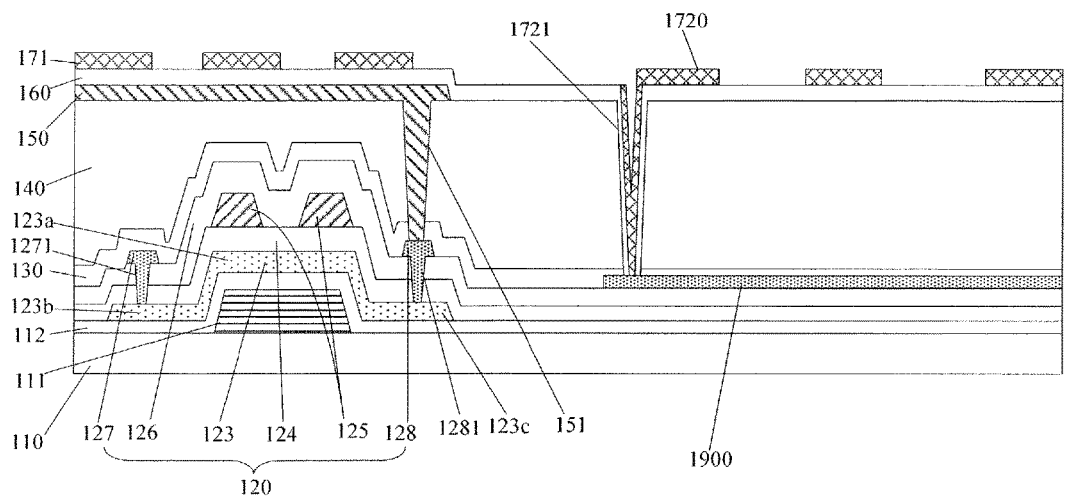
FIG. 2b is a cross-section schematic view of an array substrate according to a first embodiment of the present disclosure.

As shown in FIG. 2b, an array substrate according to the present embodiment comprises a base substrate 110, a shielding layer 111, a buffer layer 112 and a thin film transistor 120 (only one thin film transistor 120 is shown in FIG. 2b, and the thin film transistor serves as a switching element of a sub-pixel), which are formed on the base substrate 110. The thin film transistor 120 is a low temperature polycrystalline silicon thin film transistor and comprises an active layer 123, a gate insulating layer 124, a gate electrode 125, a intermediate dielectric layer 126, and a source electrode 127 and a drain electrode 128 disposed on the intermediate dielectric layer 126 in a same layer, which are sequentially disposed on the base substrate. In the present embodiment, each touch electrode lead 1900, the source electrode 127 of the thin film transistor 120 and the drain electrode 128 are formed in a same mask process. It can be seen from FIG. 2b, touch electrode lead 1900, the source electrode 127 and the drain electrode 128 are made from a same material and are disposed in a same layer.

Figure 2C:
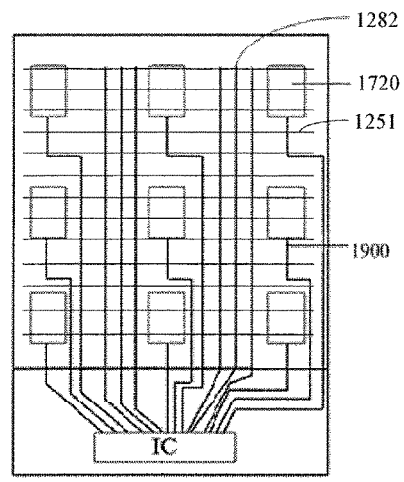
FIG. 2c is a top schematic view of an array substrate according to the first embodiment of the present disclosure.

FIG. 2c is a top schematic view of an array substrate according to the present embodiment of the present disclosure. It can be seen from FIG. 2c that the touch electrode leads 1900 are disposed in the space between the data lines 1282, and the touch electrode leads 1900 and data lines 1282 extend along the longitudinal direction. In FIG. 2c, the gate lines 1251 and the touch electrode leads 1900 are crossed with each other in different layers.

In the present embodiment, a first insulating layer 130, a planarizing layer 140, pixel electrodes 150, a second insulating layer 160 and a common electrode layer can be formed in sequence on the base substrate 110 with the thin film transistor 120 being formed thereon.

In an example, common electrodes 171 and touch electrodes 1720 can be disposed in the common electrode layer, i.e., touch electrodes 1720 and common electrodes 171 are disposed in a same layer and are made of a same material.

In an example, touch electrodes 1720 and touch electrode leads are connected through via holes 1721; the via holes 1721 can be formed in the mask process in which the via holes for connecting common electrodes 171 and the corresponding common electrode lines (not shown in FIG. 2b) are formed.

In the present embodiment, touch electrode leads 1900, source electrodes 127 and drain electrodes 128 are formed in a same mask process, touch electrodes 1720 and common electrodes 171 are formed in a same mask process, and the via holes 1721 for connecting touch electrodes 1720 and the corresponding touch electrode leads 1900 and the via holes for connecting common electrodes 171 and the corresponding common electrode lines are formed in a same mask process. Therefore, the present embodiment effectively simplifies the process of fabricating the array substrate and reduces the amount of masks.

The present embodiment further provides a fabricating method of an array substrate comprising the following steps S101 to S112 which will be described one by one as follows.

Step S101: forming a shielding layer 111 on a base substrate 110 through a first mask process.

Step S102: forming a buffer layer 112 covering the shielding layer 111.

Step S103: forming an active layer 123 on the buffer layer 112 through a second mask process.

Step S104: forming a gate insulating layer 124 covering the active layer 123; forming a photoresist pattern on the gate insulating layer 124 through a third mask process; then doping the active layer 123 with the photoresist pattern as a mask to form an active region 123a, a source doped region 123b and a drain doped region 123c in the active layer 123, and the active region 123a corresponding to the shielding layer 111, the source doped region 123b and the drain doped region 123c being located at two sides of the active region 123a respectively; and removing the photoresist after doping.

Step S105: forming gate electrodes 125, gate lines and common electrode lines on the gate insulating layer 124 through a fourth mask process (the gate lines and the common electrode lines are not shown in FIG. 2b).

Step S106: forming a intermediate dielectric layer 126 covering the gate electrodes 125, and forming via holes 1271 and 1281 at locations corresponding to the source doped region 123b and the drain doped region 123c respectively through a fifth mask process to expose the source doped region 123b and the drain doped region 123c.

Step S107: forming source electrodes 127, drain electrodes 128, touch electrode leads 1900 and a plurality of data lines (not shown in FIG. 2b) on the intermediate dielectric layer 126 through a sixth mask process. The source electrodes 127 contact the source doped regions 123b through the via holes 1271, and the drain electrodes 128 contacts the drain doped regions 123c through the via holes 1281.

Step S108: forming a first passivation layer 130 covering a thin film transistor 120.

Step S109: forming a planarizing layer 140 on the first passivation layer 130, and forming via holes 151 at locations corresponding to the drain electrodes 128 through a seventh mask process to expose the drain electrodes 128.

Step S110: forming pixel electrodes 150 on the planarizing layer 140 through a eighth mask process, and the pixel electrodes 150 contact the drain electrodes 128 through the via holes 151.

Step S111: forming a second passivation layer 160 covering the pixel electrodes 150, and forming via holes at locations corresponding to the common electrode lines (not shown in FIG. 2b) to expose the common electrode lines; and forming via holes 1721 at locations corresponding to the touch electrode leads 1900 to expose the touch electrode leads 1900.

Step S112: forming common electrodes 171 and touch electrodes 1720 on the second passivation layer 160 through a tenth mask process. The common electrode 171 and the corresponding common electrode lines are connected through the via holes, and the touch electrodes 1720 and the corresponding touch electrode lead 1900 are connected through the via holes 1721.

It can be seen from the above steps S101 to S112, compared with the fabricating method as shown in FIG. 1, the fabricating method according to the present embodiment only needs 12 steps and 10 mask processes, saving two steps and two masks. The process and the amount of masks are effectively reduced.

It should be noted that the via holes 1721 for connecting touch electrodes 1720 and touch electrode leads 1900 also can be formed in plural mask processes. For example, the via holes can be formed at locations corresponding to touch electrode leads 1900 while forming the via holes 151 in the planarizing layer, and then the material in the via holes of pixel electrodes and the material in the via holes of the second passivation layer are etched away in the subsequent process. In addition, common electrode lines and gate lines are formed in a same mask process, which case is only taken as an example to describe herein. Common electrode lines also can be disposed in other layers according to actual requirement.

Second Embodiment

Figure 3A:
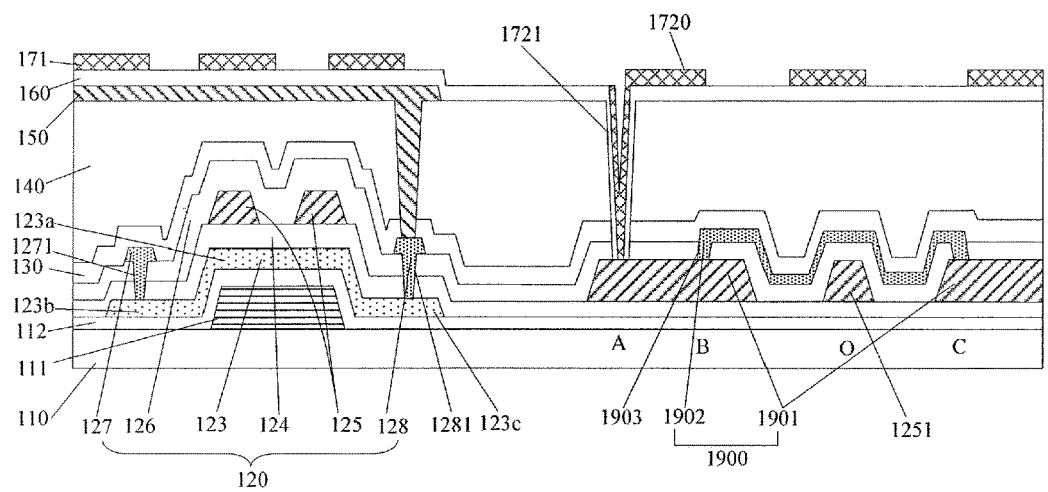
FIG. 3a is a cross-section schematic view of an array substrate according to a second embodiment of the present disclosure.
Figure 3B:
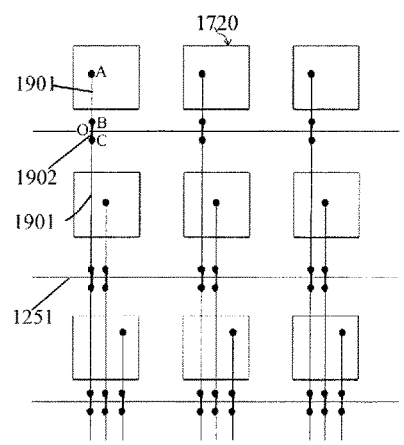
FIG. 3b is a top schematic view of an array substrate according to the second embodiment of the present disclosure.

FIG. 3a and FIG. 3b are cross-section schematic view and top schematic view of an array substrate according to the second embodiment of the present disclosure respectively. As shown in FIG. 3a and FIG. 3b, a different technical feature between the present embodiment and the first embodiment lies in: each touch electrode lead 1900 and at least one gate line 1251 are crossed with and insulated from each other, and each touch electrode lead 1900 comprises at least two first linear portions 1901 (as shown in the part between A and B) and at least one first bridging portion 1902 (as shown in the part between B and C); at the location "O" where the touch electrode lead 1900 and the gate line 1251 intersect with each other, the first bridging portion 1902 connects the two adjacent first linear portions 1901 through via holes 1903.

As shown in FIG. 3a and FIG. 3b, in one example, first linear portions 1901, gate electrodes 125 and gate lines 1251 are made from a same material and are disposed in same layer; in one example, first bridging portions 1902, source electrodes 127, drain electrodes 128 and data lines (not shown in the figure) are made from a same material and are disposed in same layer. Of course, the present embodiment is not limited to this.

Correspondingly, the present embodiment provides a fabricating method of the array substrate as shown in FIG. 3a. Generally, the method is same as the method provided by the first embodiment, only needs 12 steps and 10 masks to finish the fabricating of the array substrate. However, the difference is as follows.

In the step S105, forming gate electrodes 125, a plurality of gate lines 1251, common electrode lines and the first portions 1901 of touch electrode leads 1900 on the gate insulating layer 124 through a fourth mask process, and at least one gate line 1251 is disposed in the space between adjacent first linear portions 1901.

In step S106, forming a intermediate dielectric layer 126 covering the gate electrodes 125, and forming first via holes 1271 and 1281 at locations corresponding to the source doped regions 123b and the drain doped regions 123c respectively through a fifth mask process to expose the source doped regions 123b and the drain doped regions 123c; and second via holes 1903 are formed at locations "B" and "C" of two adjacent first linear portions.

In step S107, forming source electrodes 127, drain electrodes 128, first bridging portions 1902 of touch electrode leads 1900 and a plurality of data lines (not shown in FIG. 3a) on the intermediate dielectric layer 126 through a sixth mask process. The source electrodes 127 and the drain electrodes 128 contact the source doped regions 123b and the drain doped regions 123c through via holes 1271 and 1281 respectively, and first bridging portions 1902 connects two adjacent first linear portions 1901 through the second via holes 1903.

Third Embodiment

Figure 4:
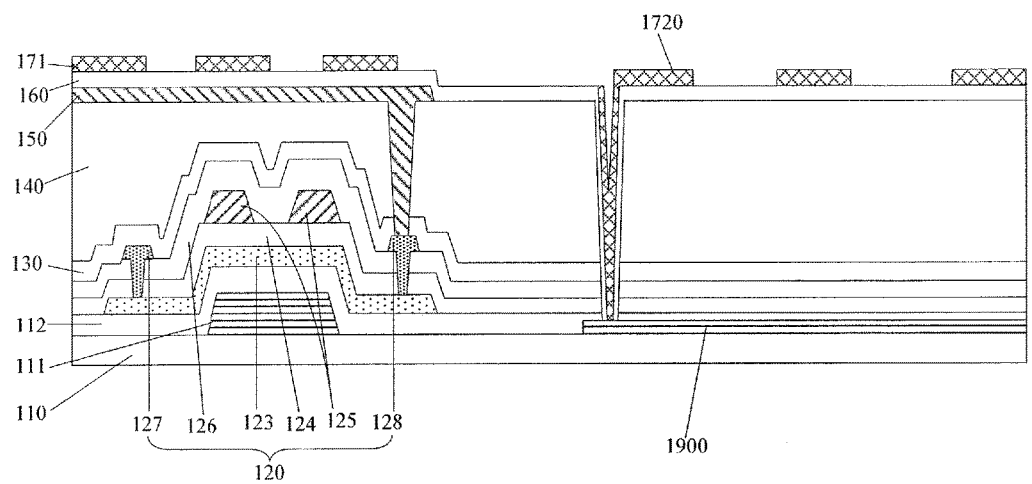
FIG. 4 is a cross-section schematic view of an array substrate according to a third embodiment of the present disclosure.

As shown in FIG. 4, a different technical feature between the present embodiment and the first embodiment lies in: each touch electrode lead 1900 and the shielding layer 111 of the thin film transistor 120 are formed in a same mask process. It can be seen from FIG. 4 that touch electrode leads 1900 and the shielding layers 111 of the thin film transistors 120 are made from a same material and are disposed in a same layer.

Correspondingly, the present embodiment provides a fabricating method of the array substrate shown in FIG. 4. Generally, the method is same as the method provided by the first embodiment, only needs 12 steps and 10 masks to finish the fabricating of the array substrate. However, the difference lies in: in the step S101, forming shielding layers 111 and touch electrode leads 1900 on a base substrate 110 through a first mask process; and touch electrode leads are not formed in steps S107.

The present embodiment provides the array substrate and the fabricating method thereof. Touch electrode leads and shielding layers of thin Film transistors are disposed in a same layer, and because there are no gate lines or data lines in the layer where the shielding layer is disposed, the arrangement of touch electrode leads in the layer can be more flexible, as long as it does not obviously affect the aperture ratio; and compared with the second embodiment, the fabricating process of touch electrode leads is simple.

Fourth Embodiment

Figure 5:
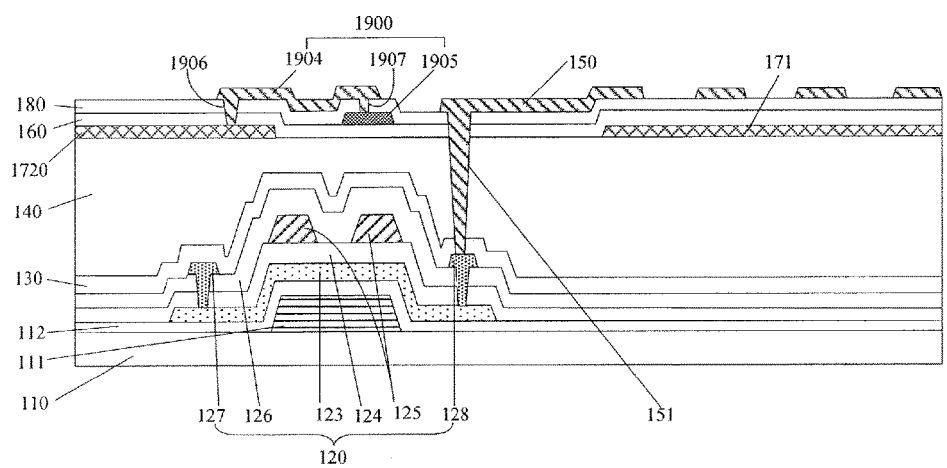
FIG. 5 is a cross-section schematic view of an array substrate according to the fourth embodiment of the present disclosure.

As shown in FIG. 5, a different technical feature between the present embodiment and the first embodiment lies in: each touch electrode lead 1900 comprises second linear portions 1905 and second bridging portions 1904, and the second bridging portions 1904 connects touch electrodes 1720 and the second linear portions 1905 of the touch electrode leads corresponding to the touch electrodes.

Common electrodes 171 are disposed in the upper layer and pixel electrodes 150 are disposed in the lower layer, which is taken as an example to describe in the first, second and third embodiments; common electrodes 171 are disposed in the lower layer and pixel electrodes 150 are disposed in the upper layer, which is taken as an example to describe in the present embodiment.

In one example, touch electrodes 1720 and common electrodes 171 are formed in a same mask process. In this case, touch electrodes 1720 and common electrodes 171 are made from a same material and are disposed in a same layer.

In one example, the second passivation layer 160 is disposed on the touch electrodes 1720 and the common electrodes 171; the second linear portions 1905 of the touch electrode leads 1900 can be formed on the second passivation layer in an individual mask process; a third passivation layer 180 covers the second linear portions 1905 of the touch electrode leads 1900; and then the pixel electrodes 150 are formed on the third passivation layer; the pixel electrodes 150 are connected to the drain electrodes 128 of the thin film transistors 120 through via holes 151; the second bridging portions 1904 of the touch electrode leads 1900 and pixel electrodes 150 are formed in a same mask process (disposed in a same layer and made from a same material) and are connected with the touch electrodes 1720 and the second linear portions 1905 through via holes 1906 and 1907 respectively.

Correspondingly, the present embodiment provides a fabricating method of the array substrate shown in FIG. 5. Because the touch electrode leads 1900 are not formed from the material of a conducting structure of a thin film transistor in the present embodiment, thus, in the method provided by the present embodiment, steps S201 to S208 are same as the steps S01 to S08 of the fabricating method shown in FIG. 1. The difference between the method provided by the present embodiment and the method provided by the first embodiment is that as follows.

In step S209, forming a planarizing layer 140 on the first passivation layer 130, and forming via holes at locations corresponding to common electrode lines (not shown in figure) through a seventh mask process to expose the common electrode lines.

In step S210, forming common electrodes 171 and touch electrodes 1720 on the planarizing layer 140 through a eighth mask process, and the common electrodes 171 and the corresponding common electrode lines are connected through the via holes formed in step S209.

Step S211: forming a second passivation layer 160 covering the common electrodes 171 and the touch electrodes 1720.

Step S212: forming second linear portions 105 of touch electrode leads 1900 on the second passivation layer 160 through a ninth mask process.

Step S213: forming a third passivation layer 180 covering the second linear portions 1905 of the touch electrode leads 1900; and forming via holes 151 corresponding to the drain electrodes 128, via holes 1906 corresponding to the touch electrodes 1720 and via holes 1907 corresponding to the second linear portions 1905 of the touch electrode leads 1900 through a tenth mask process.

Step S214: forming pixel electrodes 150 connected with the drain electrodes 128 through via holes 151, and forming second bridging portions 1904 of the touch electrode leads 1900. The second bridging portions 1904 are connected with the touch electrodes 1720 and the second linear portions 1905 of the touch electrode leads 1900 through via holes 1906 and 1907 respectively.

It can be seen from the above steps, compared with the fabricating method as shown in FIG. 1, the fabricating method according to the present embodiment only needs 11 mask processes, saving one mask.

The thin film transistors are low temperature poly-silicon thin film transistors, which is taken as an example for illustrating in the above embodiments. It also can be a thin film transistor in other type such as amorphous silicon mode and metallic oxide mode. The array substrate can use the principle of self-capacitance, or can use the principle of mutual capacitance, i.e., touch electrodes can be self-capacitance electrodes, or also can be touch driving electrodes or touch sensing electrodes. No limitation is placed in embodiments of the present disclosure.

To sum up, at least part of the touch electrode leads are fabricated in the process in which the original conducting structures are fabricated, so that the amount of masks is reduced.

What are described above is related to the illustrative embodiments of the disclosure only and not limitative to the scope of the disclosure; the scopes of the disclosure are defined by the accompanying claims.

The present application claims the priority of the Chinese Patent Application No. 201510101319.8 filed on Mar. 6, 2015, which is incorporated herein in its entirety by reference as part of the disclosure of the present application.

The invention claimed is:

1. An array substrate comprising:
a base substrate;
a plurality of touch electrodes disposed on the base substrate;
a plurality of touch electrode leads disposed on the base substrate and configured for leading out signals of the touch electrodes respectively; and
an array structure disposed on the base substrate comprising a plurality of conducting structures; wherein
at least part of each touch electrode lead and at least one of the conducting structures are disposed in a same layer and are made from a same material, the array substrate further comprises a plurality of gate lines and a plurality of data lines which are disposed on the base substrate and are insulated from the touch electrode leads, each touch electrode lead comprises at least two first linear portions and at least one first bridging portion, wherein
the at least two first linear portions and the gate lines are disposed in a same layer; the touch electrode lead intersects with at least one of the gate lines, and two adjacent first linear portions are connected through a first bridging portion at an intersection of the touch electrode lead with the gate line; or
the at least two first linear portions and the data lines are disposed in a same layer; the touch electrode lead intersects with at least one of the data lines, and two adjacent first linear portions are connected through a first bridging portion at an intersection of the touch electrode lead with the data line.

2. The array substrate according to claim 1, wherein the array structure comprises a plurality of thin film transistors; each thin film transistor comprises a gate electrode, a source electrode and a drain electrode, and the gate electrode, the source electrode and the drain electrode belong to the conducting structures.

3. The array substrate according to claim 2, wherein the array structure further comprises a plurality of shielding layers; each shielding layer is disposed between an active layer of each thin film transistor and the base substrate, and the shielding layers belong to the conducting structures.

4. The array substrate according to claim 2, wherein each touch electrode lead and one of the conducting structures are disposed in a same layer and are made from a same material, and each touch electrode lead is in a one-piece structure.

5. The array substrate according to claim 1, wherein
if the at least two first linear portions and the gate lines are disposed in a same layer, the first linear portions, the gate lines and the gate electrodes are disposed in a same layer and are made from a same material;
if the at least two first linear portions and the data lines are disposed in a same layer, the first linear portions, the data lines, the source electrodes and the drain electrodes are disposed in a same layer and are made from a same material.

6. The array substrate according to claim 1, wherein
if the at least two first linear portions and the gate lines are disposed in a same layer, the first bridging portions, the source electrodes and the drain electrodes are disposed in a same layer and are made from a same material;
if the at least two first linear portions and the data lines are disposed in a same layer, the first bridging portions and the gate electrodes are disposed in a same layer and are made from a same material.

7. The array substrate according to claim 1, wherein the array substrate further comprises a plurality of shielding layers, each shielding layer is disposed between an active layer of each thin film transistor and the base substrate, and the shielding layers belong to the conducting structures;
the first bridging portions and the shielding layers are disposed in a same layer and are made from a same material.

8. The array substrate according to claim 1, wherein
an active layer of each thin film transistor comprises an active region, a source doped region and a drain doped region, and the source electrode and the drain electrode contact with the source doped region and the drain doped region through first via holes respectively;
the first bridging portions are connected to first linear portions through second via holes, and the layer in which at least part of the second via holes are formed is same to the layer in which at least part of the first via holes are formed.

9. The array substrate according to claim 1, further comprising a common electrode layer disposed on the base substrate, wherein the touch electrodes are disposed in the common electrode layer.

10. The array substrate according to claim 9, wherein the touch electrode leads are disposed between the common electrode layer and the base substrate.

11. An array substrate, comprising:
a base substrate;
a plurality of touch electrodes disposed on the base substrate;
a plurality of touch electrode leads disposed on the base substrate and configured for leading out signals of the touch electrodes respectively; and
an array structure disposed on the base substrate comprising a plurality of conducting structures; wherein
at least part of each touch electrode lead and at least one of the conducting structures are disposed in a same layer and are made from a same material;
each touch electrode lead comprises a linear portion and a bridging portion, and the bridging portion connects a touch electrode corresponding to the touch electrode lead to the linear portion;
the array substrate further comprises a passivation layer on the base substrate; and in a direction perpendicular to the base substrate, the passivation layer is between the linear portion of the touch electrode lead and the touch electrode corresponding to the touch electrode lead;
the array structure comprises a plurality of thin film transistors and a plurality of first electrodes connected with the plurality of thin film transistors respectively, and the plurality of conducting structures comprise the plurality of first electrodes; and
the bridging portion and each of the plurality of first electrodes are disposed in a same layer and are made from a same material.

12. The array substrate according to claim 11, wherein the linear portion is disposed between the layer in which the first electrodes are disposed and the base substrate.

13. The array substrate according to claim 11, further comprising a common electrode layer disposed on the base substrate, wherein the touch electrodes are disposed in the common electrode layer.

14. The array substrate according to claim 13, wherein the linear portion is disposed between the layer in which the first electrodes are disposed and the common electrode layer, and the first electrodes are pixel electrodes.

15. A display device comprising an array substrate according to claim 1.

16. A fabricating method of an array substrate comprising:
forming a plurality of touch electrodes on a base substrate;
forming a plurality of touch electrode leads on the base substrate for leading out signals of the touch electrodes; and
forming an array structure comprising a plurality of conducting structures on the base substrate; wherein
at least part of each touch electrode lead and at least one of the conducting structures are formed in a same mask process;
each touch electrode lead is insulated from gate lines and data lines, and each touch electrode lead intersects with at least one of the gate lines or data lines;
each touch electrode lead comprises at least two first linear portion and at least one bridging portion,
wherein
the at least two first linear portions and the gate lines are disposed in a same layer; the touch electrode lead intersects with at least one of the gate lines, and two adjacent first linear portions are connected through a first bridging portion at an intersection of the touch electrode lead with the gate line, or
the at least two first linear portions and the data lines are disposed in a same layer; the touch electrode lead intersects with at least one of the data lines, and two adjacent first linear portions are connected through a first bridging portion at an intersection of the touch electrode lead with the data line, or
each touch electrode lead comprises a linear portion and a second bridging portion, and a touch electrode corresponding to the touch electrode lead and the linear portion are connected by the bridging portion.

* * * * *